United States Patent
Kang

(10) Patent No.: US 9,508,412 B2
(45) Date of Patent: *Nov. 29, 2016

(54) SEMICONDUCTOR MEMORY APPARATUS

(71) Applicant: SK hynix Inc., Icheon-si Gyeonggi-do (KR)

(72) Inventor: Khil Ohk Kang, Icheon-si Gyeonggi-do (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/872,382

(22) Filed: Oct. 1, 2015

(65) Prior Publication Data

US 2016/0027487 A1 Jan. 28, 2016

Related U.S. Application Data

(63) Continuation of application No. 13/846,769, filed on Mar. 18, 2013, now Pat. No. 9,177,618.

(30) Foreign Application Priority Data

Nov. 20, 2012 (KR) ........................ 10-2012-0131431

(51) Int. Cl.
  *G11C 8/08* (2006.01)
  *G11C 8/18* (2006.01)
  *G11C 7/04* (2006.01)
  *G11C 7/22* (2006.01)

(52) U.S. Cl.
  CPC . *G11C 8/18* (2013.01); *G11C 7/04* (2013.01); *G11C 7/222* (2013.01); *G11C 8/08* (2013.01)

(58) Field of Classification Search
  CPC .................................. G11C 7/222; G11C 8/08
  USPC ............................................ 365/194, 230.06
  See application file for complete search history.

(56) References Cited

U.S. PATENT DOCUMENTS

| | | | |
|---|---|---|---|
| 2006/0012930 A1* | 1/2006 | Oh .................... | H03K 19/00369 361/91.6 |
| 2007/0103425 A1* | 5/2007 | Tanaka ................. | G09G 3/3648 345/102 |
| 2012/0211642 A1* | 8/2012 | Iwamoto ............ | H04N 5/35509 250/208.1 |
| 2012/0249619 A1* | 10/2012 | Furukawa ............ | G09G 3/3648 345/691 |

* cited by examiner

*Primary Examiner* — Michael Tran
(74) *Attorney, Agent, or Firm* — William Park & Associates Ltd.

(57) ABSTRACT

A semiconductor memory apparatus includes a bank; a temperature sensor configured to generate a temperature voltage of which voltage level is changed according to a temperature variation of the bank; and a timing control block configured to control a timing of a signal to be inputted to the bank, according to the voltage level of the temperature voltage.

6 Claims, 5 Drawing Sheets

600

SEMICONDUCTOR MEMORY APPARATUS

CROSS-REFERENCES TO RELATED APPLICATION

The present application is a Continuation of U.S. application Ser. No. 13/846,769, filed on Mar. 18, 2013, and the present application claims priority under 35 U.S.C. §119(a) to Korean application number 10-2012-0131431, filed on Nov. 20, 2012, in the Korean Intellectual Property Office, which is incorporated herein by reference in its entirety.

BACKGROUND

1. Technical Field

Various embodiments relate to a semiconductor integrated circuit, and more particularly, to a semiconductor memory apparatus.

2. Related Art

A semiconductor memory apparatus is configured to store inputted data and output stored data. In a semiconductor memory apparatus, regions where data are stored are referred to as banks. A semiconductor memory apparatus is configured to include a plurality of banks.

A semiconductor memory apparatus is constituted by a large number of transistors, and a bank is constituted by transistors as well. The transistors react sensitively to a temperature variation. For example, the threshold voltage of a transistor rises as a temperature rises, and the threshold voltage of a transistor falls as a temperature falls.

A voltage level required to turn on a transistor rises as the threshold voltage of the transistor rises, and a voltage level required to turn on a transistor falls as the threshold voltage of the transistor falls.

Therefore, since a voltage level to turn on a transistor rises as a temperature rises, a turn-on timing of the transistor becomes late, and, since a voltage level to turn on a transistor falls as a temperature falls, a turn-on timing of the transistor becomes early.

If turn-on timings of transistors change according a temperature, the response characteristics of a semiconductor memory apparatus constituted by transistors change as well.

Referring to FIG. 1, a conventional semiconductor memory apparatus includes first to fourth banks 10 to 40, and a signal transfer block 50.

The first bank 10 operates in response to a first command signal CMD_1.

The second bank 20 operates in response to a second command signal CMD_2.

The third bank 30 operates in response to a third command signal CMD_3.

The fourth bank 40 operates in response to a fourth command signal CMD_4.

The signal transfer block 50 outputs an internal command signal CMD_internal as one signal of the first to fourth command signals CMD_1 to CMD_4 in response to first and second bank select signals BANK_sel<0:1>. For example, the signal transfer block 50 outputs the internal command signal CMD_internal as the first command signal CMD_1 in the case where both the first and second bank select signals BANK_sel<0:1> are low levels. The signal transfer block 50 outputs the internal command signal CMD_internal as the second command signal CMD_2 in the case where the first bank select signal BANK_sel<0> is a high level and the second bank select signal BANK_sel<1> is the low level. The signal transfer block 50 outputs the internal command signal CMD_internal as the third command signal CMD_3 in the case where the first bank select signal BANK_sel<0> is the low level and the second bank select signal BANK_sel<1> is a high low level. The signal transfer block 50 outputs the internal command signal CMD_internal as the fourth command signal CMD_4 in the case where both the first and second bank select signals BANK_sel<0:1> are the high levels.

If the internal command signal CMD_internal is an active signal, one bank of the first to fourth banks 10 to 40 is activated. Also, if the internal command signal CMD_internal is a read signal or a write signal, one bank of the first to fourth banks 10 to 40 performs a read operation or a write operation.

Each of the first to fourth banks 10 to 40 may perform an operation according to the internal command signal CMD_internal. The temperature of a bank which operates more may be higher than the temperature of a bank which operates less.

If the temperatures of the respective banks vary, since the responding speeds of the respective banks change, the operation timings of the respective banks change, and thus, signals cannot help but be inputted to and outputted from the respective banks at different timings.

Therefore, if the output timings of the signals outputted from the respective banks change, a signal mismatch may occur in internal circuits, and this phenomenon may cause a mis-operation of a semiconductor memory apparatus.

SUMMARY

In one embodiment of the present invention, a semiconductor memory apparatus may include: a bank; a temperature sensor configured to generate a temperature voltage of which voltage level is changed according to a temperature variation of the bank; and a timing control block configured to control a timing of a signal to be inputted to the bank, according to the voltage level of the temperature voltage.

In another embodiment of the present invention, a semiconductor memory apparatus may include: a first bank operating in response to a first command signal; a second bank operating in response to a second command signal; a first temperature sensor configured to generate a first temperature voltage according to a temperature variation of the first bank; a second temperature sensor configured to generate a second temperature voltage according to a temperature variation of the second bank; a signal transfer block configured to output an internal command signal as a first preliminary command signal or a second preliminary command signal in response to a bank select signal; and a timing control block configured to delay the first and second preliminary command signals according to voltage levels of the first and second temperature voltages, and output the first and second command signals.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

Figure 1:
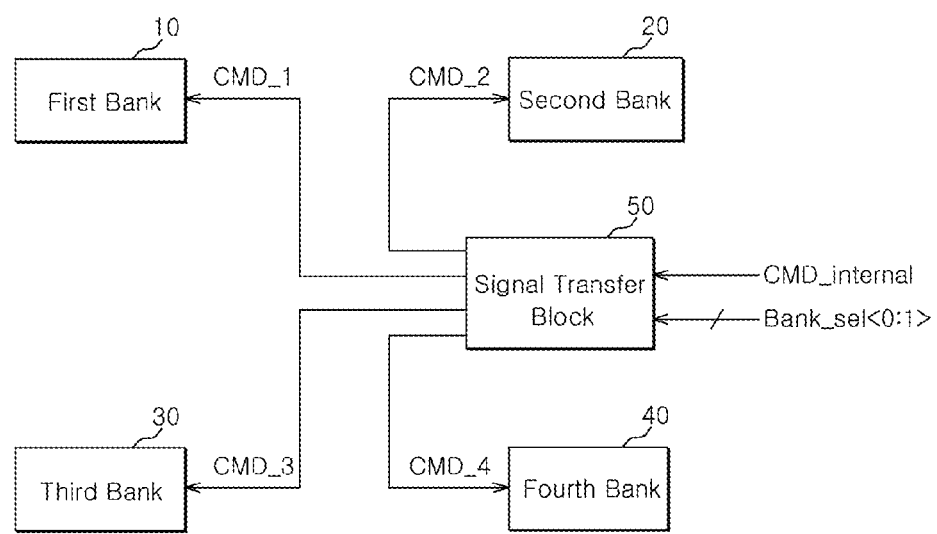
FIG. 1 is a configuration diagram of a conventional semiconductor memory apparatus.
Figure 2:
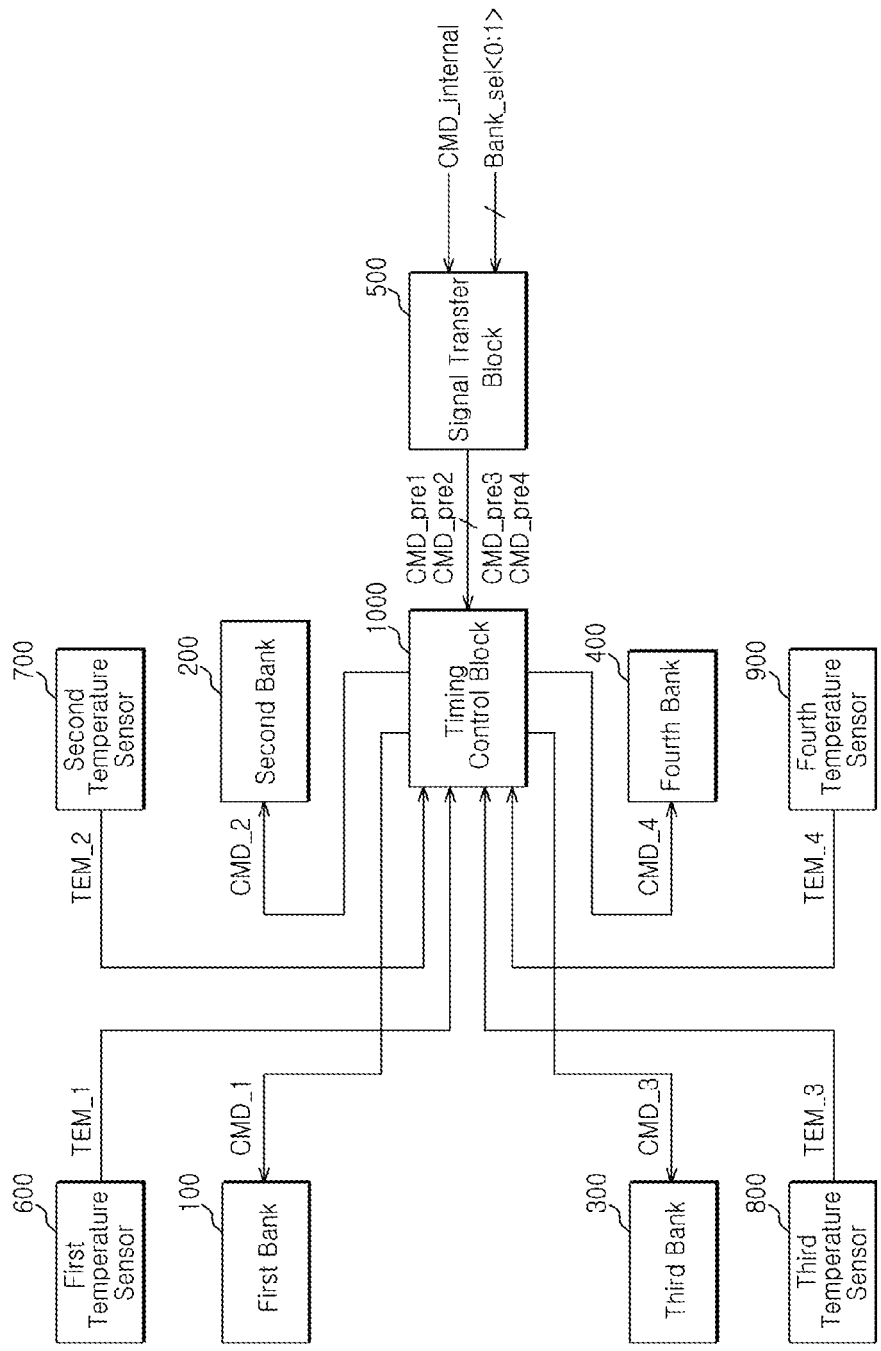
FIG. 2 is a configuration diagram of a semiconductor memory apparatus in accordance with an embodiment of the present invention.

Referring to FIG. 2, a semiconductor memory apparatus in accordance with an embodiment of the present invention may include first to fourth banks 100, 200, 300 and 400, a signal transfer block 500, first to fourth temperature sensors 600, 700, 800 and 900, and a timing control block 1000.

The first bank 100 may operate in response to a first command signal CMD_1.

The second bank 200 may operate in response to a second command signal CMD_2.

The third bank 300 may operate in response to a third command signal CMD_3.

The fourth bank 400 may operate in response to a fourth command signal CMD_4.

The first to fourth command signals CMD_1 to CMD_4 which are received by the first to fourth banks 100 to 400 may be all kinds of command signals, such as an active signal, a read signal, a write signal and a refresh signal, which may be received by banks.

The signal transfer block 500 may be configured to output an internal command signal CMD_internal as one signal of first to fourth preliminary command signals CMD_pre1 to CMD_pre4 in response to first and second bank select signals BANK_sel<0:1>. For example, the signal transfer block 500 may output the internal command signal CMD_internal as the first preliminary command signal CMD_pre1 in a case where both the first and second bank select signals BANK_sel<0:1> are low levels. The signal transfer block 500 may output the internal command signal CMD_internal as the second preliminary command signal CMD_pre2 in a case where the first bank select signal BANK_sel<0> is a high level and the second bank select signal BANK_sel<1> is the low level. The signal transfer block 500 may output the internal command signal CMD_internal as the third preliminary command signal CMD_pre3 in a case where the first bank select signal BANK_sel<0> is the low level and the second bank select signal BANK_sel<1> is the high level. The signal transfer block 500 may output the internal command signal CMD_internal as the fourth preliminary command signal CMD_pre4 in the case where both the first and second bank select signals BANK_sel<0:1> are the high levels.

The first temperature sensor 600 may be configured to generate a first temperature voltage TEM_1 according to a temperature variation of the first bank 100. For example, the first temperature sensor 600 may generate the first temperature voltage TEM_1 of which a voltage level rises as the temperature of the first bank 100 rises.

The second temperature sensor 700 may be configured to generate a second temperature voltage TEM_2 according to a temperature variation of the second bank 200. For example, the second temperature sensor 700 may generate the second temperature voltage TEM_2 of which voltage level rises as the temperature of the second bank 200 rises.

The third temperature sensor 800 may be configured to generate a third temperature voltage TEM_3 according to a temperature variation of the third bank 300. For example, the third temperature sensor 800 may generate the third temperature voltage TEM_3 of which voltage level rises as the temperature of the third bank 300 rises.

The fourth temperature sensor 900 may be configured to generate a fourth temperature voltage TEM_4 according to a temperature variation of the fourth bank 400. For example, the fourth temperature sensor 900 may generate the fourth temperature voltage TEM_4 of which voltage level rises as the temperature of the fourth bank 400 rises.

The first to fourth temperature sensors 600 to 900 are differentiated only in positions where they are disposed, and may be configured in the same way. Therefore, the description of the configuration of the first temperature sensor 600 will replace the descriptions of the configurations of the other temperature sensors 700 to 900.

Figure 3:
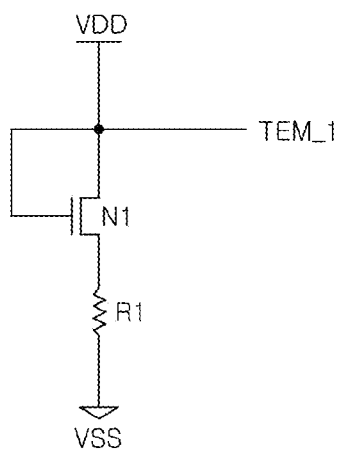
FIG. 3 is a circuit diagram of the first temperature sensor of FIG. 2.

Referring to FIG. 3, the first temperature sensor 600 includes a transistor N1 and a resistor R1. The transistor N1 has the drain which may be applied with an external voltage VDD and a gate to which the drain is coupled. The resistor R1 may have one end to which the source of the transistor N1 is coupled and an other end to which a ground terminal VSS is coupled. The first temperature voltage TEM_1 may be outputted from a node to which the gate and the drain of the transistor N1 are coupled.

Operations of the first temperature sensor 600 will be described below.

The transistor N1 may be applied with the same voltage VDD through the gate and the drain and may conduct current from the source to the resistor R1, and the resistor R1 may conduct current to the ground terminal VSS. If the threshold voltage of the transistor N1 rises as a temperature rises, an amount of current may be conducted from the transistor N1 to the resistor R1 decreases. If the amount of current which is conducted by the transistor N1 to the resistor R1 decreases, the voltage level of the node to which the drain and the source of the transistor N1 are coupled may rise higher than when a temperature is low. Also, if the threshold voltage of the transistor N1 falls as a temperature falls, an amount of current conducted from the transistor N1 to the resistor R1 may increase. If the amount of current which is conducted by the transistor N1 to the resistor R1 increases, the voltage level of the node to which the drain and the source of the transistor N1 are coupled may fall lower than when a temperature is high.

As a result, the temperature sensor 600 may generate the first temperature voltage TEM_1 which has a higher voltage level as a temperature rises.

The timing control block 1000 may be configured to delay the first to fourth preliminary command signals CMD_pre1 to CMD_pre4 according to the first to fourth temperature voltages TEM_1 to TEM_4, and output the first to fourth command signals CMD_1 to CMD_4. For example, the timing control block 1000 may determine whether to delay the first preliminary command signal CMD_pre1, according to the voltage level of the first temperature voltage TEM_1; and output the first preliminary command signal CMD_pre1 which is determined in terms of whether to be delayed or not, as the first command signal CMD_1. The timing control block 1000 may determine whether to delay the second preliminary command signal CMD_pre2, according to the voltage level of the second temperature voltage TEM_2; and output the second preliminary command signal CMD_pre2 which is determined in terms of whether to be delayed or not, as the second command signal CMD_2. The timing control block 1000 may determine whether to delay the third preliminary command signal CMD_pre3, according to the voltage level of the third temperature voltage TEM_3; and output the third preliminary command signal CMD_pre3 which is determined in terms of whether to be delayed or not, as the third command signal CMD_3. The timing control block 1000 may determine whether to delay the fourth preliminary command signal CMD_pre4, according to the voltage level of the fourth temperature voltage TEM_4; and output the fourth preliminary command signal CMD_pre4 which is determined in terms of whether to be delayed or not, as the fourth command signal CMD_4.

Figure 4:
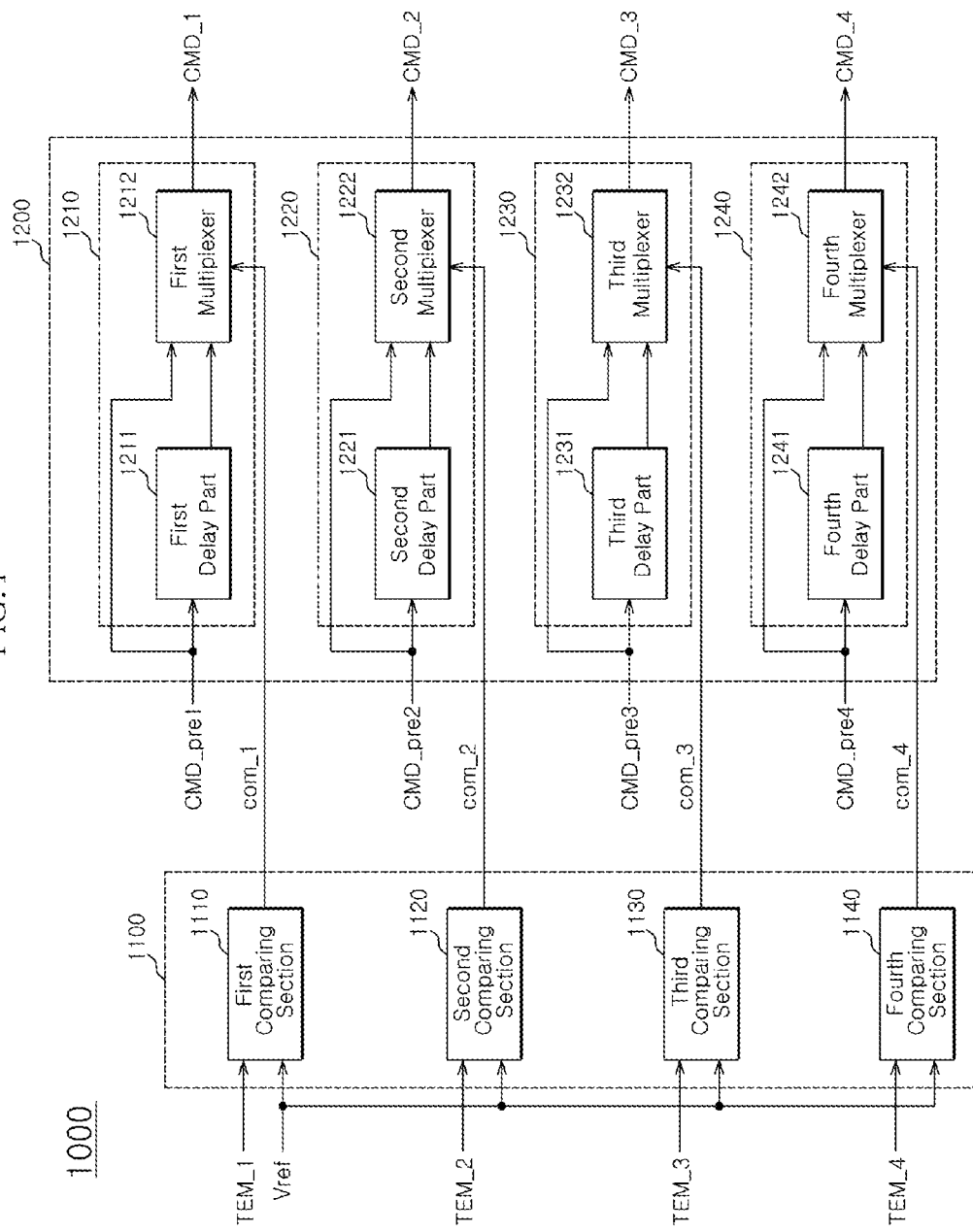
FIG. 4 is a configuration diagram of the timing control block of FIG. 2.

Referring to FIG. 4, the timing control block 1000 may include a comparison signal generation unit 1100, and an output timing control unit 1200.

The comparison signal generation unit 1100 may be configured to compare a reference voltage Vref which has a constant voltage level regardless of a temperature variation and the respective voltage levels of the first to fourth temperature voltages TEM_1 to TEM_4, and generate first to fourth comparison signals com_1 to com_4.

The comparison signal generation unit 1100 may include first to fourth comparing sections 1110 to 1140. The first comparing section 1110 may be configured to compare the voltage levels of the reference voltage Vref and the first temperature voltage TEM_1 and generate the first comparison signal com_1. The second comparing section 1120 may be configured to compare the voltage levels of the reference voltage Vref and the second temperature voltage TEM_2 and generate the second comparison signal com_2. The third comparing section 1130 may be configured to compare the voltage levels of the reference voltage Vref and the third temperature voltage TEM_3 and generate the third comparison signal com_3. The fourth comparing section 1140 may be configured to compare the voltage levels of the reference voltage Vref and the fourth temperature voltage TEM_4 and generate the fourth comparison signal com_4.

The output timing control unit 1200 may be configured to determine whether to delay the first preliminary command signal CMD_pre1, in response to the first comparison signal com_1; and output the first preliminary command signal CMD_pre1 which is determined in terms of whether to be delayed or not, as the first command signal CMD_1. The output timing control unit 1200 may be configured to determine whether to delay the second preliminary command signal CMD_pre2, in response to the second comparison signal com_2; and output the second preliminary command signal CMD_pre2 which is determined in terms of whether to be delayed or not, as the second command signal CMD_2. The output timing control unit 1200 may be configured to determine whether to delay the third preliminary command signal CMD_pre3, in response to the third comparison signal com_3; and output the third preliminary command signal CMD_pre3 which is determined in terms of whether to be delayed or not, as the third command signal CMD_3. The output timing control unit 1200 may be configured to determine whether to delay the fourth preliminary command signal CMD_pre4, in response to the fourth comparison signal com_4; and output the fourth preliminary command signal CMD_pre4 which is determined in terms of whether to be delayed or not, as the fourth command signal CMD_4.

The output timing control unit 1200 may include first to fourth command signal output sections 1210 to 1240.

The first command signal output section 1210 may be configured to determine whether to delay the first preliminary command signal CMD_pre1, in response to the first comparison signal com_1; and output the first preliminary command signal CMD_pre1 which is determined in terms of whether to be delayed or not, as the first command signal CMD_1.

The first command signal output section 1210 may include a first delay part 1211 and a first multiplexer 1212. The first delay part 1211 may be configured to delay the first preliminary command signal CMD_pre1. The first multiplexer 1212 may be configured to output the first preliminary command signal CMD_pre1 as the first command signal CMD_1 or output the output signal of the first delay part 1211 as the first command signal CMD_1, in response to the first comparison signal com_1.

The second command signal output section 1220 may be configured to determine whether to delay the second preliminary command signal CMD_pre2, in response to the second comparison signal com_2; and output the second preliminary command signal CMD_pre2 which may be determined in terms of whether to be delayed or not, as the second command signal CMD_2.

The second command signal output section 1220 may include a second delay part 1221 and a second multiplexer 1222. The second delay part 1221 may be configured to delay the second preliminary command signal CMD_pre2. The second multiplexer 1222 may be configured to output the second preliminary command signal CMD_pre2 as the second command signal CMD_2; or output the output signal of the second delay part 1221 as the second command signal CMD_2, in response to the second comparison signal com_2.

The third command signal output section 1230 may be configured to determine whether to delay the third preliminary command signal CMD_pre3, in response to the third comparison signal com_3; and output the third preliminary command signal CMD_pre3 which is determined in terms of whether to be delayed or not, as the third command signal CMD_3.

The third command signal output section 1230 may include a third delay part 1231 and a third multiplexer 1232. The third delay part 1231 may be configured to delay the third preliminary command signal CMD_pre3. The third multiplexer 1232 may be configured to output the third preliminary command signal CMD_pre3 as the third command signal CMD_3 or output the output signal of the third delay part 1231 as the third command signal CMD_3, in response to the third comparison signal com_3.

The fourth command signal output section 1240 may be configured to determine whether to delay the fourth preliminary command signal CMD_pre4, in response to the fourth comparison signal com_4; and output the fourth preliminary command signal CMD_pre4 which is determined in terms of whether to be delayed or not, as the fourth command signal CMD_4.

The fourth command signal output section 1240 may include a fourth delay part 1241 and a fourth multiplexer 1242. The fourth delay part 1241 may be configured to delay the fourth preliminary command signal CMD_pre4. The fourth multiplexer 1242 may be configured to output the fourth preliminary command signal CMD_pre4 as the fourth command signal CMD_4; or output the output signal of the fourth delay part 1241 as the fourth command signal CMD_4, in response to the fourth comparison signal com_4.

Operations of the semiconductor memory apparatus in accordance with the embodiment of the present invention, configured as mentioned above, will be described below with reference to FIG. 5.

The first to fourth temperature sensors 600, 700, 800 and 900 of FIG. 2 may generate the first to fourth temperature voltages TEM_1 to TEM_4 of which voltage levels rise as a temperature rises.

The first to fourth comparing sections 1110, 1120, 1130 and 1140 of FIG. 4 may compare the voltage levels of the respective first to fourth temperature voltages TEM_1 to TEM_4 and the voltage level of the reference voltage Vref, and may generate the first to fourth comparison signals com_1 to com_4.

Figure 5:
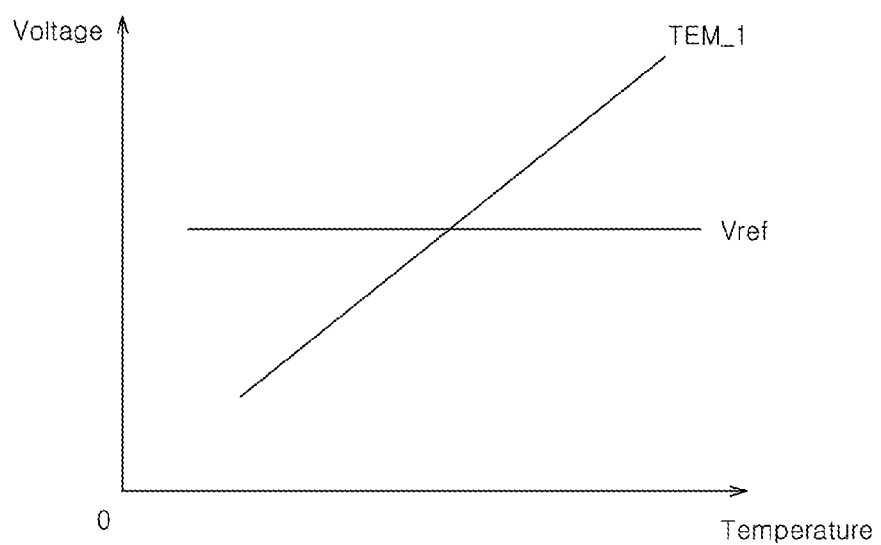
FIG. 5 is a graph explaining the semiconductor memory apparatus in accordance with the embodiment of the present invention.

As shown in FIG. 5, the reference voltage Vref may be a voltage which has a constant voltage level regardless of a temperature variation. By comparing the voltage levels of the reference voltage Vref and the first temperature voltage TEM_1, it may be possible to know whether the temperature of the first bank 100 of FIG. 2 is higher or lower than a preset temperature.

If the voltage level of the first temperature voltage TEM_1 is lower than the voltage level of the reference voltage Vref, the first comparing section 1110 may disable the first comparison signal com_1. If the voltage level of the first temperature voltage TEM_1 is higher than the voltage level of the reference voltage Vref, the first comparing section 1110 may enable the first comparison signal com_1. That is to say, in the case where the first comparison signal com_1 is disabled, the temperature of the first bank 100 may be lower than the preset temperature. Further, in the case where the first comparison signal com_1 is enabled, the temperature of the first bank 100 may be higher than the preset temperature.

Since the second to fourth temperature sensors 700, 800 and 900 are configured in the same way as the first temperature sensor 600, the voltage levels of the second to fourth temperature voltages TEM_2, TEM_3 and TEM_4 may rise as a temperature rises, similarly to the first temperature voltage TEM_1.

The second to fourth comparing sections 1120, 1130 and 1140 may configured in the same way as the first comparing section 1110. The second comparing section 1120 may compare the voltage levels of the second temperature voltage TEM_2 and the reference voltage Vref. The third comparing section 1130 may compare the voltage levels of the third temperature voltage TEM_3 and the reference voltage Vref. The fourth comparing section 1140 may compare the voltage levels of the fourth temperature voltage TEM_4 and the reference voltage Vref.

Hence, the fact that the second to fourth comparison signals com_2, com_3 and com_4 are disabled means that the temperatures of the second to fourth banks 200, 300 and 400 may be lower than the preset temperature. Moreover, the fact that the second to fourth comparison signals com_2, com_3 and com_4 are enabled means that the temperatures of the second to fourth banks 200, 300 and 400 may be higher than the preset temperature.

Whether to delay the signals to be inputted to the respective banks 100, 200, 300 and 400 may be determined in response to the first to fourth comparison signals com_1 to com_4. The input timings of the respective command signals CMD_1 to CMD_4 to be inputted to the respective banks 100, 200, 300 and 400 may be controlled according to determination results.

Describing examples, in the case where the internal command signal CMD_internal is inputted to the first bank 100 as the first command signal CMD_1, if the first comparison signal com_1 is enabled, the internal command signal CMD_internal may be inputted to the first bank 100 as the first command signal CMD_1 by being delayed. Conversely, in the case where the internal command signal CMD_internal is inputted to the first bank 100 as the first command signal CMD_1, if the first comparison signal com_1 is disabled, the internal command signal CMD_internal may be inputted to the first bank 100 as the first command signal CMD_1 by being not delayed.

In the case where the internal command signal CMD_internal is inputted to the second bank 200 as the second command signal CMD_2, if the second comparison signal com_2 is enabled, the internal command signal CMD_internal may be inputted to the second bank 200 as the second command signal CMD_2 by being delayed. Conversely, in the case where the internal command signal CMD_internal is inputted to the second bank 200 as the second command signal CMD_2, if the second comparison signal com_2 is disabled, the internal command signal CMD_internal may be inputted to the second bank 200 as the second command signal CMD_2 by being not delayed.

In the case where the internal command signal CMD_internal is inputted to the third bank 300 as the third command signal CMD_3, if the third comparison signal com_3 is enabled, the internal command signal CMD_internal may be inputted to the third bank 300 as the third command signal CMD_3 by being delayed. Conversely, in the case where the internal command signal CMD_internal is inputted to the third bank 300 as the third command signal CMD_3, if the third comparison signal com_3 is disabled, the internal command signal CMD_internal may be inputted to the third bank 300 as the third command signal CMD_3 by being not delayed.

In the case where the internal command signal CMD_internal is inputted to the fourth bank 400 as the fourth command signal CMD_4, if the fourth comparison signal com_4 is enabled, the internal command signal CMD_internal may be inputted to the fourth bank 400 as the fourth command signal CMD_4 by being delayed. Conversely, in the case where the internal command signal CMD_internal is inputted to the fourth bank 400 as the fourth command signal CMD_4, if the fourth comparison signal com_4 is disabled, the internal command signal CMD_internal may be inputted to the fourth bank 400 as the fourth command signal CMD_4 by being not delayed.

As is apparent from the above descriptions, in the semiconductor memory apparatus in accordance with an embodiment of the present invention, the input timings of signals to be inputted to respective banks may be controlled according to the temperatures of the respective banks. Therefore, in the semiconductor memory apparatus in accordance with the embodiment of the present to invention, it may be possible to prevent the output timings of signals to be outputted from the respective banks from being changed according to the temperatures thereof As a result it may possible to avoid the occurrence of a mismatch in signals to be inputted and outputted among internal circuits.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:
1. A semiconductor comprising:
a first circuit;
a second circuit;
a first temperature sensor configured to generate a first temperature voltage in response to a temperature of the first circuit;

a second temperature sensor configured to generate a second temperature voltage in response to a temperature of the second circuit;

a signal transfer block configured to output a signal to one of the first circuit and the second circuit in response to an circuit select signal; and a timing control block configured to control a timing of the signal in response to the first and second temperature information, wherein the timing control block determines whether to delay the signal, according to the voltage level of the first temperature voltage, and outputs the signal which is determined in terms of whether to be delayed or not, to the first circuit, and wherein the timing control block determines whether to delay the signal, according to the voltage level of the second temperature voltage, and outputs the signal which is determined in terms of whether to be delayed or not, to the second circuit.

2. The semiconductor according to claim 1,
wherein the first temperature sensor generates the first temperature voltage of which voltage level increases as the temperature of the first circuit increases, and
wherein the second temperature sensor generates the second temperature voltage of which voltage level increases as the temperature of the second circuit increases.

3. The semiconductor memory apparatus according to claim 1, wherein the timing control block comprises:
a comparison signal generation unit configured to compare a reference voltage of which voltage level is constant regardless of a temperature variation and the respective voltage levels of the first and second temperature voltages, and generate a first comparison signal and a second comparison signal; and an output timing control unit configured to determine whether to delay the signal in response to the first comparison signal and the second comparison signal and output the signal which is determined in terms of whether to be delayed or not to one of the first circuit and the second circuit according to the circuit select signal.

4. The semiconductor according to claim 3, wherein the comparison signal generation unit comprises:
a first comparing section configured to compare the voltage levels of the reference voltage and the first temperature voltage and generate the first comparison signal; and
a second comparing section configured to compare the voltage levels of the reference voltage and the second temperature voltage and generate the second comparison signal.

5. The semiconductor according to claim 4,
wherein the output timing control unit comprises:
a first delay part configured to delay and output the signal;
a first multiplexer configured to output one of the signal and a signal from the first delay part, in response to one of the first comparison signal;
a second delay part configured to delay and output the signal; and
a second multiplexer configured to output one of the signal and a signal from the second delay part, in response to the second comparison signal.

6. The semiconductor according to claim 1,
Wherein the first circuit includes a first semiconductor memory apparatus and the second circuit includes a second semiconductor memory apparatus.

* * * * *